(12) United States Patent
Topgaard et al.

(10) Patent No.: US 9,791,534 B2
(45) Date of Patent: Oct. 17, 2017

(54) PULSE SEQUENCE METHOD FOR MRI

(71) Applicant: CR Development AB, Lund (SE)

(72) Inventors: Daniel Topgaard, Lund (SE); Samo Lasic, Lund (SE); Markus Nilsson, Oxie (SE)

(73) Assignee: CR DEVELOPMENT AB, Lund (SE)

( * ) Notice: Subject to any disclaimer, the term of this patent is extended or adjusted under 35 U.S.C. 154(b) by 516 days.

(21) Appl. No.: 14/398,325

(22) PCT Filed: May 3, 2013

(86) PCT No.: PCT/SE2013/050492
§ 371 (c)(1),
(2) Date: Oct. 31, 2014

(87) PCT Pub. No.: WO2013/165312
PCT Pub. Date: Nov. 7, 2013

(65) Prior Publication Data
US 2015/0115957 A1    Apr. 30, 2015

Related U.S. Application Data

(60) Provisional application No. 61/642,594, filed on May 4, 2012.

(30) Foreign Application Priority Data

May 4, 2012    (SE) ...................................... 1250452

(51) Int. Cl.
*G01R 33/565* (2006.01)
*G01R 33/48* (2006.01)
(Continued)

(52) U.S. Cl.
CPC ....... *G01R 33/565* (2013.01); *G01R 33/4818* (2013.01); *G01R 33/5615* (2013.01); *G01R 33/56341* (2013.01)

(58) Field of Classification Search
CPC ............ G01R 33/565; G01R 33/56341; G01R 33/4818; G01R 33/5615
See application file for complete search history.

(56) References Cited

U.S. PATENT DOCUMENTS 5,786,692 A * 7/1998 Maier ............... G01R 33/56341
324/307
6,288,540 B1    9/2001 Chen et al.
(Continued)

FOREIGN PATENT DOCUMENTS

JP    2003500137 A    1/2003
JP    2004081657 A    3/2004
(Continued)

OTHER PUBLICATIONS

Basser, Peter J. et al. "MR Diffusion Tensor Spectroscopy and Imaging." *Biophysical Journal*, vol. 66 (Jan. 1994): 259-267.
(Continued)

*Primary Examiner* — G. M. Hyder
(74) *Attorney, Agent, or Firm* — Harness, Dickey & Pierce, PLC

(57) ABSTRACT

The present invention describes a method for magnetic resonance (MR) and/or MR imaging, comprising acquisition of signals and MR images originating from a RF and gradient sequence causing isotropic diffusion weighting of signal attenuation, wherein the isotropic diffusion weighting is achieved by one time-dependent dephasing vector q(t) having an orientation, wherein the isotropic diffusion weighting is proportional to the trace of a diffusion tensor D, and wherein the orientation of the time-dependent dephasing vector q(t) is either varied discretely in more than three directions in total, or changed continuously, or changed in a combination of discretely and continuously during the gradient pulse sequence, $0 \leq t \leq$ echo time, where t represents the
(Continued)

time. The method may be performed during a single shot (single MR excitation).

9 Claims, 5 Drawing Sheets

(51) Int. Cl.
*G01R 33/563* (2006.01)
*G01R 33/561* (2006.01)

(56) References Cited

U.S. PATENT DOCUMENTS

| | | | |
|---|---|---|---|
| 6,724,190 | B2 | 4/2004 | van Muiswinkel et al. |
| 7,355,407 | B1 | 4/2008 | Zhang |
| 8,274,283 | B2 | 9/2012 | Liu et al. |
| 2003/0214290 | A1 | 11/2003 | van Muiswinkel et al. |
| 2008/0116889 | A1 | 5/2008 | Hu et al. |
| 2010/0152567 | A1 | 6/2010 | Bryskhe et al. |
| 2010/0271021 | A1 | 10/2010 | Liu et al. |
| 2010/0298692 | A1 | 11/2010 | Schmainda et al. |
| 2011/0038521 | A1 | 2/2011 | Degani et al. |
| 2012/0049845 | A1 | 3/2012 | Bito et al. |
| 2012/0062229 | A1 | 3/2012 | Topgaard |
| 2015/0130458 | A1* | 5/2015 | Topgaard ............... G01N 24/08 324/309 |
| 2016/0187448 | A1* | 6/2016 | Topgaard ............... G01N 24/08 324/309 |

FOREIGN PATENT DOCUMENTS

| | | |
|---|---|---|
| JP | 2008136871 A | 6/2008 |
| JP | 2009524830 A | 7/2009 |

OTHER PUBLICATIONS

Basser, Peter J. and Carlo Pierpaoli. "Microstructural and Physiological Features of Tissues Elucidated by Quantitative-Diffusion-Tensor MRI." *Journal of Magnetic Resonance*, series B, vol. 111 (1996): 209-219.
Beaulieu, Christian. "The basis of anisotropic water diffusion in the nervous system—a technical review." *NMR in Biomedicine*, vol. 15 (2002): 435-455.
Callaghan, P.T. and I. Furó. "Diffusion-diffusion correlation and exchange as a signature for local order and dynamics." *Journal of Chemical Physics*, vol. 120, No. 8 (Feb. 2004): 4032-4038.
Callaghan, P.T. and M.E. Komlosh. "Locally anisotropic motion in a macroscopically isotropic system: displacement correlations measured using double pulsed gradient spin-echo NMR." *Magnetic Resonance in Chemistry*, vol. 40 (2002): S15-S19.
Callaghan, P.T. and O. Soderman. "Examination of the Lamellar Phase of Aerosol OT/Water Using Pulsed Field Gradient Nuclear Magnetic Resonance." *Journal of Physical Chemistry*, vol. 87 (1983): 1737-1744.
de Graaf, Robin A. et al. "Single-Shot Diffusion Trace $^1$H NMR Spectroscopy." *Magnetic Resonance in Medicine*, vol. 45 (2001): 741-748.
Frisken, Barbara J. "Revisiting the method of cumulants for the analysis of dynamic light-scattering data." *Applied Optics*, vol. 40, No. 24 (Aug. 2001): 4087-4091.
Hubbard, Penny L. et al. "Orientational Anisotropy in the Polydomain Lamellar Phase of a Lyotropic Liquid Crystal." *Langmuir*, vol. 22 (2006): 3999-4003.
Hubbard, Penny L. et al. "A Study of Anisotropic Water Self-Diffusion and Defects in the Lamellar Mesophase." *Langmuir*, vol. 21 (2005): 4340-4346.
Hürlimann, M.D. et al. "Restricted Diffusion in Sedimentary Rocks. Determination of Surface-Area-to-Volume Ration and Surface Relaxivity." *Journal of Magnetic Resonance*, series A, vol. 111 (1994): 169-178.

Jensen, Jens H. and Joseph A. Helpern. "MRI Quantification of Non-Gaussian Water Diffusion by Kurtosis Analysis." *NMR Biomedicine*, vol. 23, No. 7 (Aug. 2010): 698-710.
Komlosh, M.E. et al. "Detection of microscopic anisotropy in gray matter and in a novel tissue phantom using double Pulsed Gradient Spin Echo MR." *Journal of Magnetic Resonance*, vol. 189 (2007): 38-45.
Komlosh, M.E. "Observation of Microscopic Diffusion Anisotropy in the Spina Cord Using Double-Pulsed Gradient Spin Echo MRI." *Magnetic Resonance in Medicine*, vol. 59 (2008): 803-809.
Mariette, François et al. "$^1$H NMR Diffusometry Study of Water in Casein Dispersions and Gels." *Journal of Agricultural Food Chemistry*, vol. 50 (2002): 4295-4302.
Mitra, Partha P. "Multiple wave-vector extensions of the NMR pulsed-field-gradient spin-echo diffusion measurement." *Physical Review B*, vol. 51 No. 21 (Jun. 1995): 15074-15078.
Mori, Susumu and Peter C.M. van Zijl. "Diffusion Weighting by the Trace of the Diffusion Tensor within a Single Scan." *Magnetic Resonance in Medicine*, vol. 33 (1995): 41-52.
Moseley, Michael E. et al. "Anisotropy in Diffusion-Weighted MRI." *Magnetic Resonance in Medicine*, vol. 19 (1991): 321-326.
Shemesh, Noam and Yoram Cohen. "Microscopic and Compartment Shape Anisotropies in Gray and White Matter Revealed by Angular Bipolar Double-PFG MR." *Magnetic Resonance in Medicine*, vol. 65 (2011): 1216-1227.
Shemesh, Noam et al. "Probing Microscopic Architecture of Opaque Heterogeneous Systems Using Double-Pulsed-Field-Gradient NMR." *Journal of the American Chemical Society*, vol. 133 (2011): 6028-6035.
Topgaard, Daniel et al. "Restricted Self-Diffusion of Water in a Highly Concentrated W/O Emulsion Studied Using Modulated Gradient Spin-Echo NMR." *Journal of Magnetic Resonance*, vol. 156 (2002): 195-201.
Topgaard, Daniel and Olle Söderman. "Self-Diffusion in Two-and Three-Dimensional Powders of Anisotropic Domains: An NMR Study of the Diffusion of Water in Cellulose and Starch." *The Journal of Physical Chemistry B*, vol. 106, No. 46 (Nov. 2002): 11887-11892.
Valette, Julien et al. "A New Sequence for Single-Shot Diffusion-Weighted NMR Spectroscopy by the Trace of the Diffusion Tensor." *Magnetic Resonance in Medicine*, vol. 68 (2012): 1705-1712.
Lawrenz et al: "A tensor model and measures of microscopic anisotropy for double-wave-vector diffusion-weighting experiments with long mixing times", Journal of Magnetic Resonance, USA, Jan. 2010, vol. 202, nr.1 , p. 43-56.
Von Mengershausen et al: "3D diffusion tensor imaging with 2D navigated turbo spin echo", Magnetic Resonance Materials in Physics, Biology and Medicine, DE, Sep. 2009, vol. 18, nr.4, p. 206-216.
Freidlin et al. "A spin echo sequence with a single-sided bipolar diffusion gradient pulse to obtain snapshot diffusion weighted images in moving media", Journal of Magnelic Resonance, USA, Apr. 2012, vol. 221, p. 24-31.
Lawrenz et al:"Double-wave-vector diffusion-weighting experiments with multiple concatenations at long mixing times", Journal of Magnetic Resonance, USA, Sep. 2010, vol. 206 nr.1, p. 112-119.
Finsterbusch et al: "A tensor approach to double wave vector diffusion-weighting experiments on restricted diffusion",; Journal of Magnetic Resonance, USA, Nov. 2008, vol. 195, nr.1, p. 23-32.
Jiang et al: "Microscopic diffusion tensor imaging of the mouse brain", NeuraImage, USA, 2010, vol. 50, nr.2, p. 465-471.
Moffat et al: "Diffusion imaging for evaluation of tumor therapies in preclinical animal models", Magnetic Resonance Materials in Physics, Biology and Medicine, DE, Dec. 2004, vol. 17, nr.3-6, p. 249-259.
Wong et al: "Optimized isotropic diffusion weighting", Magnetic; Resonance in Medicine, USA, 1995, vol. 34, nr.2, p. 139-143.
International Search Report PCT/ISA/210 for International Application No. PCT/SE2013/050473 Dated Aug. 30, 2013.
Butts, Kim et al. "Isotropic Diffusion-Weighted and Spiral-Navigated Interleaved EPI for Routine Imaging of Acute Stroke." *Magnetic Resonance in Medicine* 38.5 (Jan. 1997): 741-749.

(56) References Cited

OTHER PUBLICATIONS

Eriksson, Stefanie et al. "Isotropic diffusion weighting in PGSE NMR by magic-angle spinning of the q-vector." *Journal of Magnetic Resonance* 226 (Nov. 2012): 13-18.
Extended European Search Report dated Nov. 16, 2016 issued in corresponding European Application No. 13785251.3.
Japanese Office Action dated Feb. 28, 2017 issued in corresponding Japanese Application No. 2015-510231 (with translation).

\* cited by examiner

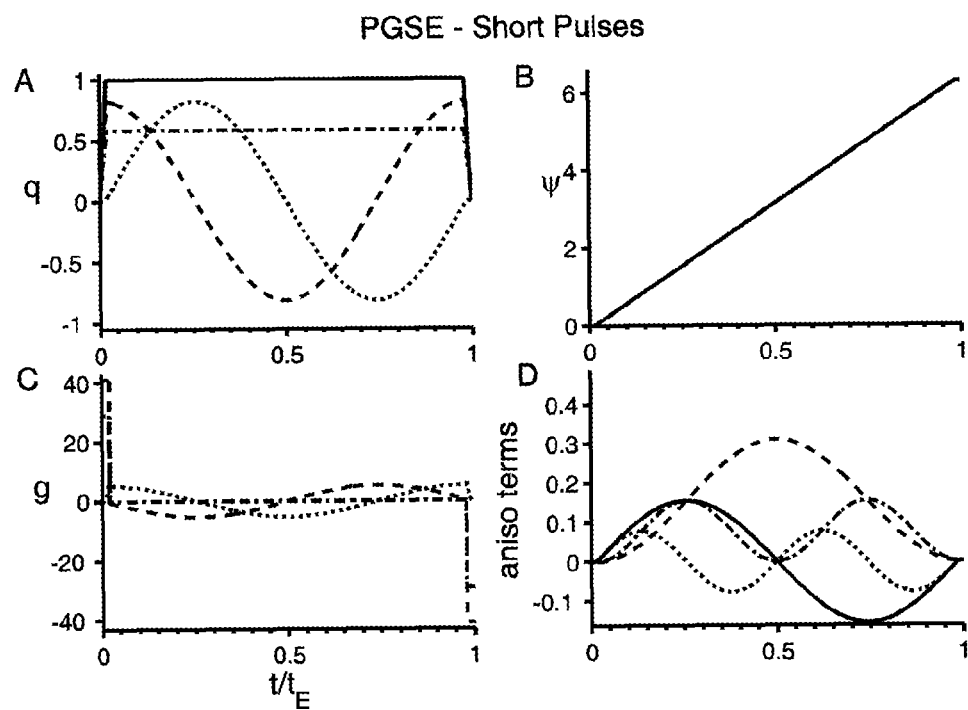
Fig. 1A-D
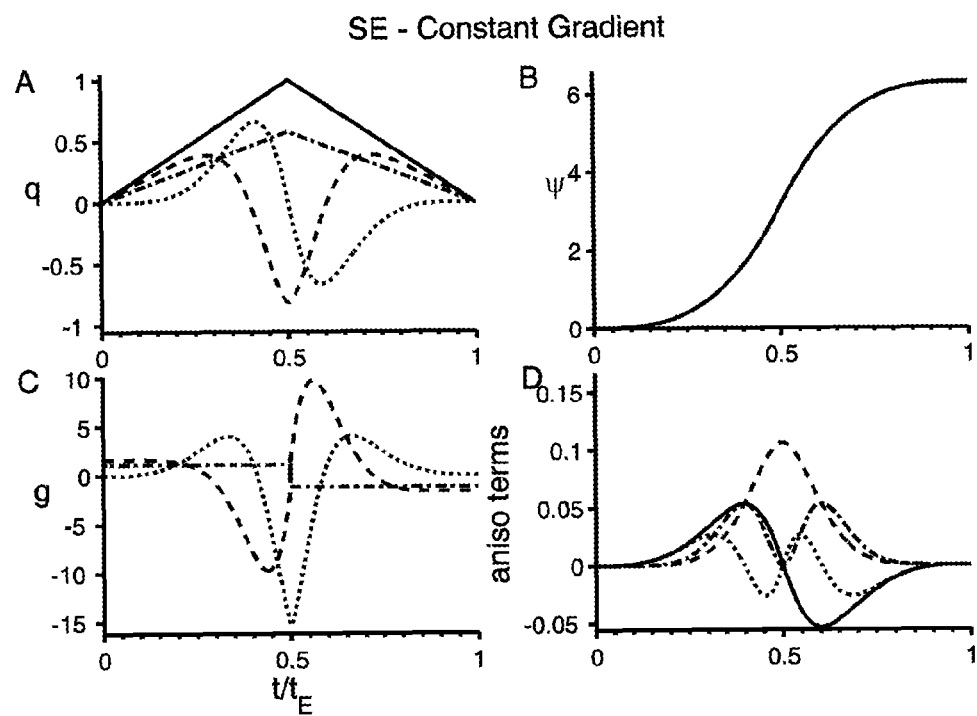
Fig. 2A-D

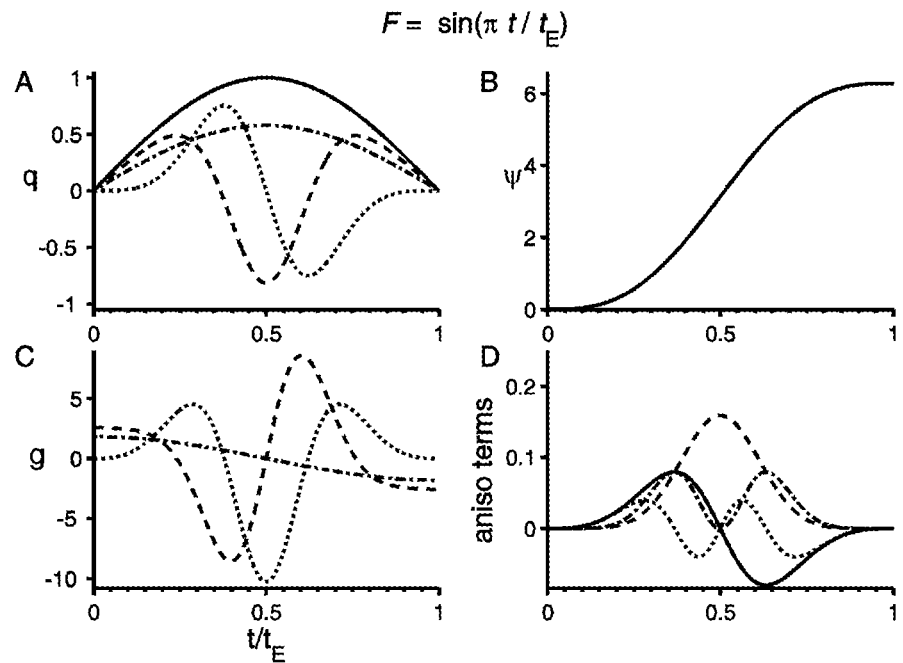
Fig. 3A-D
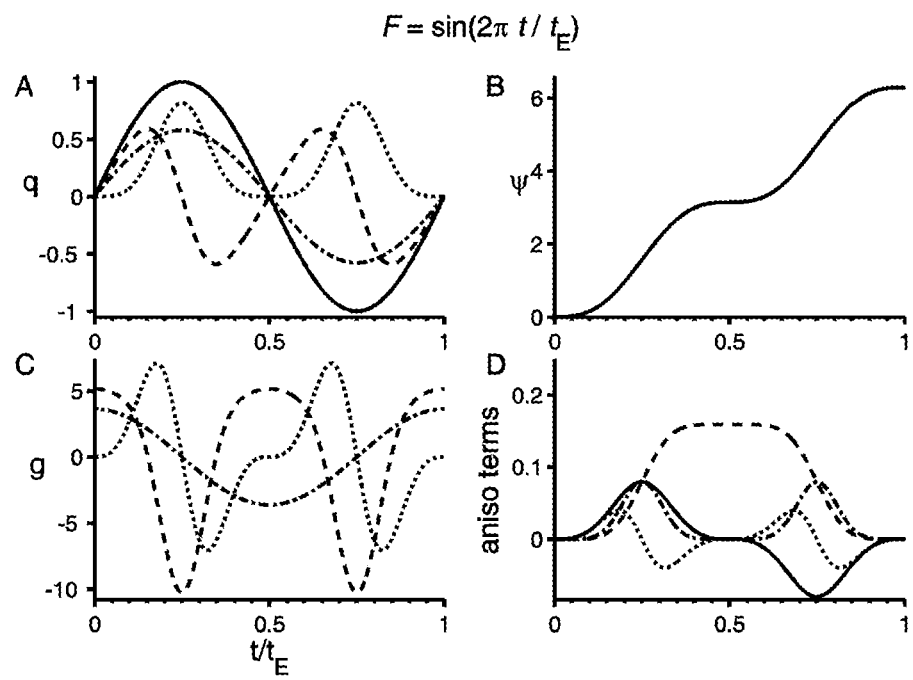
Fig. 4A-D

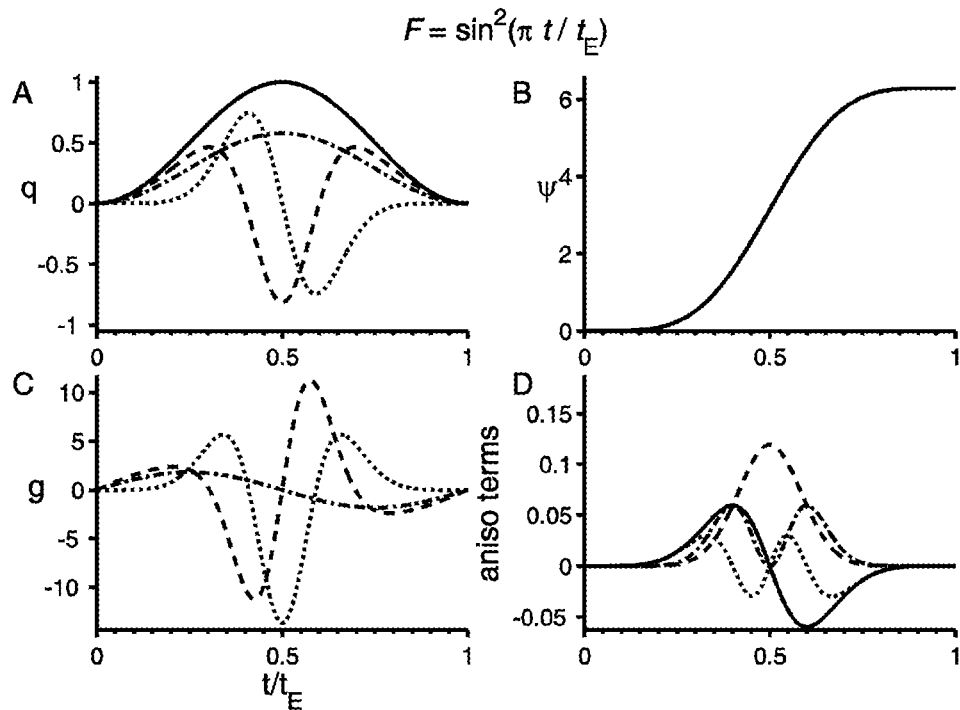
Fig. 5A-D
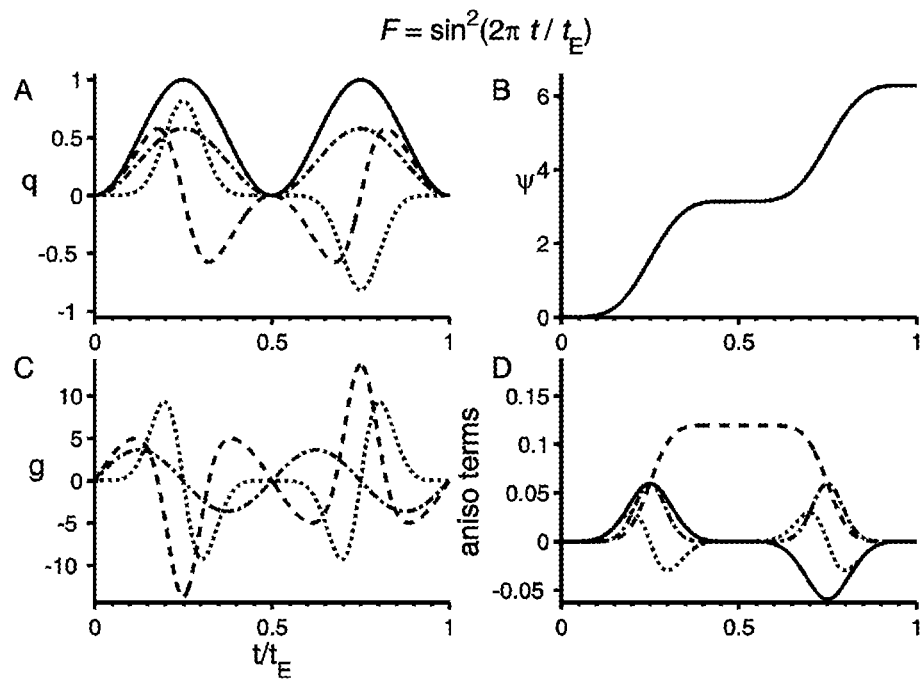
Fig. 6A-D

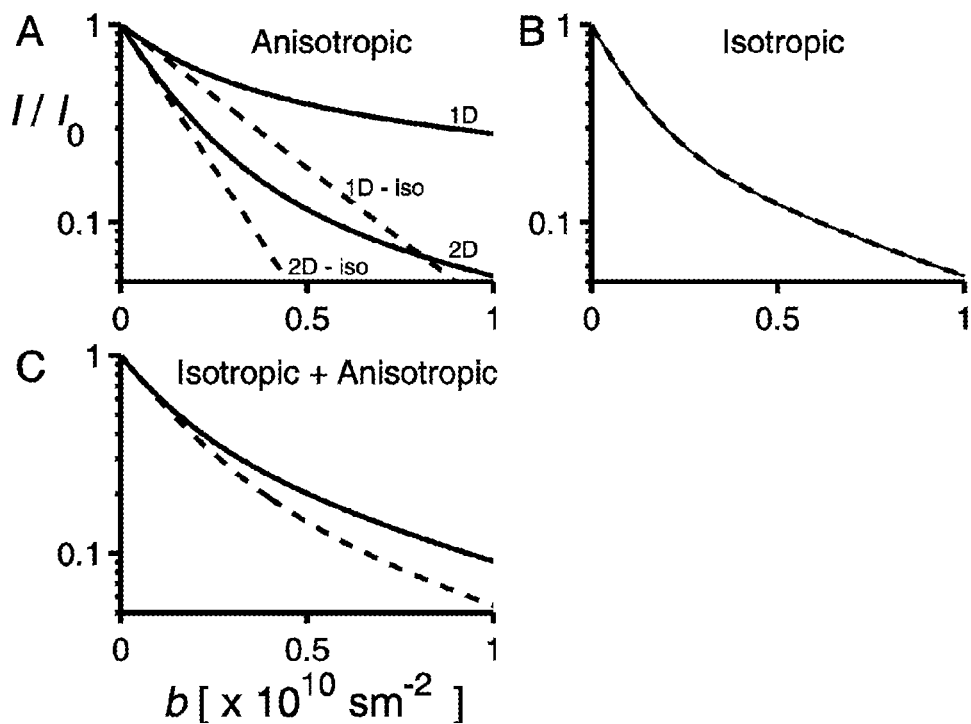
Fig. 7A-C
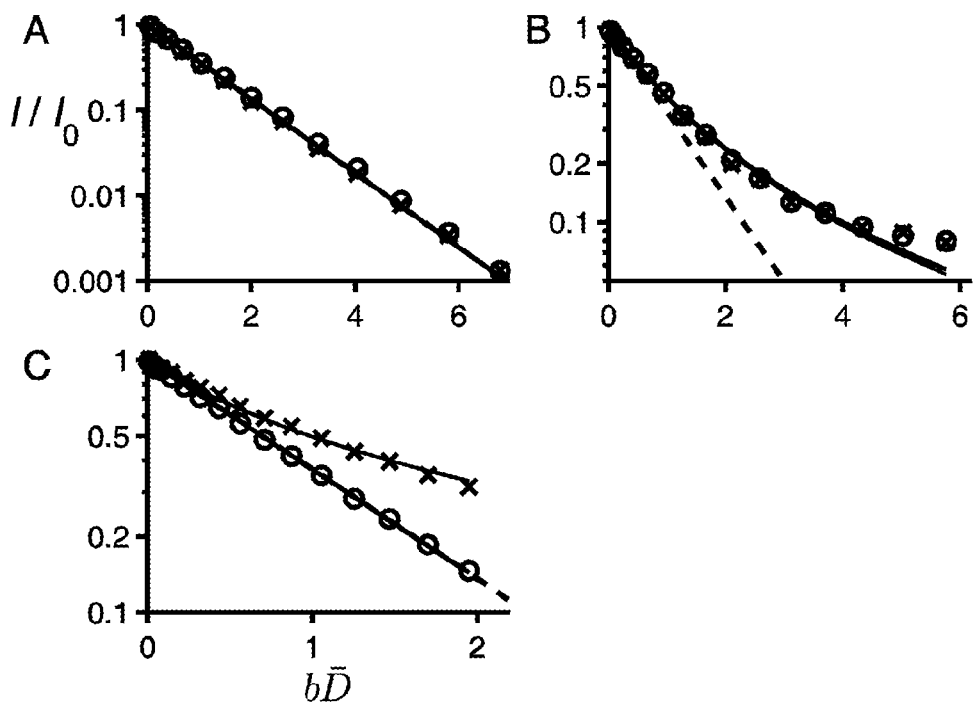
Fig. 8A-C

PULSE SEQUENCE METHOD FOR MRI

CROSS-REFERENCE TO RELATED APPLICATIONS

This is a National Phase of, and claims priority under 35 U.S.C. §120 to, National Application No. PCT/SE2013/050492, filed May 3, 2013, which claims priority to U.S. Provisional Application No. 61/642,594, filed May 4, 2012, and SE 1250452-8, filed on May 4, 2012.

FIELD OF THE INVENTION

The present invention relates to a method for magnetic resonance (MR) and/or MR imaging, comprising acquisition of signals and MR images originating from a RF and gradient sequence causing isotropic diffusion weighting of signal attenuation.

TECHNICAL BACKGROUND

Molecular self-diffusion measured with NMR (Callaghan, 2011 in "Translational Dynamics & Magnetic Resonance" (Oxford, Oxford University Press); Price, 2009 in "NMR Studies of Translational Motion" (Cambridge, Cambridge University Press)) is used to non-invasively study the morphology of the water-filled pore space of a wide range of materials, e.g., rocks (Hürlimann et al., 1994 "Restricted diffusion in sedimentary rocks. Determination of surface-area-to-volume ratio and surface relaxivity". J Magn Reson A 111, 169-178), emulsions (Topgaard et al., 2002, "Restricted self-diffusion of water in a highly concentrated W/O emulsion studied using modulated gradient spin-echo NMR". J Magn Reson 156, 195-201.), and cheese (Mariette et al., 2002, "¹H NMR diffusometry study of water in casein dispersions and gels". J Agric Food Chem 50, 4295-4302.).

Anisotropy of the pore structure renders the water self-diffusion anisotropic, a fact that is utilized for three-dimensional mapping of nerve fiber orientations in the white matter of the brain where the fibers have a preferential direction on macroscopic length scales (Basser et al., 1994, "MR diffusion tensor spectroscopy and imaging". Biophys J 66, 259-267; Beaulieu, 2002, "The basis of anisotropic water diffusion in the nervous system—a technical review". NMR Biomed 15, 435-455; Moseley et al., 1991, "Anisotropy in diffusion-weighted MRI". Magn Reson Med 19, 321-326.). The degree of the macroscopic diffusion anisotropy is often quantified by the non-dimensional fractional anisotropy index (Basser and Pierpaoli, 1996, "Microstructural and physiological features of tissues elucidated by quantitative-diffusion-tensor MRI". J Magn Reson B 111, 209-219.).

Also microscopic anisotropy in a globally isotropic material can be detected with diffusion NMR, originally through the characteristic curvature observed in the echo attenuation of conventional single-PGSE (pulse gradient spin-echo) techniques (Callaghan and Söderman, 1983, in "Examination of the lamellar phase of aerosol OT/water using pulsed field gradient nuclear magnetic resonance". J Phys Chem 87, 1737-1744; Topgaard and Söderman, 2002, in "Self-diffusion in two- and three-dimensional powders of anisotropic domains: An NMR study of the diffusion of water in cellulose and starch". J Phys Chem B 106, 11887-11892.) and, more recently, by using double-PGSE approaches in which the NMR signal is encoded for displacements over two separate time periods (Mitra, 1995, in "Multiple wave-vector extension of the NMR pulsed-field-gradient spin-echo diffusion measurement". Phys Rev B 51, 15074-15078.). The presence of microscopic anisotropy can be inferred by comparing echo attenuation data obtained with collinear and orthogonal displacement encoding (Callaghan and Komlosh, 2002, in "Locally anisotropic motion in a macroscopically isotropic system: displacement correlations measured using double pulsed gradient spin-echo NMR". Magn Reson Chem 40, S15-S19.; Komlosh et al., 2007, in "Detection of microscopic anisotropy in gray matter and in novel tissue phantom using double Pulsed Gradient Spin Echo MR". J Magn Reson 189, 38-45.; Komlosh et al., 2008, in "Observation of microscopic diffusion anisotropy in the spinal cord using double-pulsed gradient spin echo MRI". Magn Reson Med 59, 803-809.), by the characteristic signal modulations observed when varying the angle between the directions of displacement encoding (Mitra, 1995, in "Multiple wave-vector extension of the NMR pulsed-field-gradient spin-echo diffusion measurement". Phys Rev B 51, 15074-15078.; Shemesh et al., 2011, in "Probing Microscopic Architecture of Opaque Heterogeneous Systems Using Double-Pulsed-Field-Gradient NMR". J Am Chem Soc 133, 6028-6035, and "Microscopic and Compartment Shape Anisotropies in Gray and White Matter Revealed by Angular Bipolar Double-PFG MR". Magn Reson Med 65, 1216-1227.), or by a two-dimensional correlation approach (Callaghan and Furó, 2004, in "Diffusion-diffusion correlation and exchange as a signature for local order and dynamics". J Chem Phys 120, 4032-4038; Hubbard et al., 2005, 2006, in "A study of anisotropic water self-diffusion and defects in the lamellar mesophase". Langmuir 21, 4340-4346, and "Orientational anisotropy in polydomain lamellar phase of a lyotropic liquid crystal". Langmuir 22, 3999-4003.).

There is a growing interest in single-shot isotropic diffusion weighted techniques, aiming at reducing the scan time of clinical diffusion MRI experiments in which the mean diffusivity is of interest. Mean diffusivity can be determined from the trace of the diffusion tensor, which requires diffusion measurements in several directions. In the context of clinical MRI (magnetic resonance imaging) and MRS (magnetic resonance spectroscopy), a number of different gradient modulation schemes have been suggested for determining the trace of the diffusion tensor for macroscopically anisotropic materials in a single experiment (de Graaf et al., 2001, in "Single-Shot Diffusion Trace 1H NMR Spectroscopy". Magn Reson Med 45, 741-748; Mori and van Zijl, 1995, in "Diffusion weighting by the trace of the diffusion tensor within a single scan". Magn Reson Med 33, 41-52.; Valette et al., 2012, in "A New Sequence for Single-Shot Diffusion-Weighted NMR Spectroscopy by the Trace of the Diffusion Tensor". Magn Reson Med early view.). Although the actual schemes vary, the effective gradient modulation is often equivalent to a triple-PGSE experiment.

The prolonged echo times, required by the above schemes to achieve isotropic diffusion weighting, are unfavourable due to reduced signal to noise levels. Short echo-times may also be a necessary condition to achieve isotropic diffusion weighting at short characteristic length-scales of micro-anisotropy. Furthermore, the above techniques rely on gradient pulses to quickly increase dephasing factors from zero to its maximum value and decrease it back to zero after the diffusion encoding time in each orthogonal direction during the sequence. Such approach may impose unnecessarily high performance demands on MR(I) gradient equipment.

One aim of the present invention is to provide a method improving inter alia the time needed for using a sequence in MR(I) for obtaining isotropic diffusion weighting and where the signal-to-noise ratio also is improved in comparison to the known methods disclosed above.

SUMMARY OF THE INVENTION

The purpose above is achieved by a method for magnetic resonance (MR) and/or MR imaging, comprising acquisition of signals and MR images originating from a radio frequency (RF) and gradient sequence causing isotropic diffusion weighting of signal attenuation, wherein the isotropic diffusion weighting is proportional to the trace of a diffusion tensor D, and wherein the isotropic diffusion weighting is achieved by one time-dependent dephasing vector q(t) having an orientation, and wherein the orientation of the time-dependent dephasing vector q(t) is either varied discretely in more than three directions in total, or changed continuously, or changed in a combination of discretely and continuously during the gradient pulse sequence, 0≤t≤echo time, where t represents the time.

The expression "time-dependent dephasing vector" implies that both the magnitude and the direction of the dephasing vector are time-dependent. The aim of the present invention is to provide a method for achieving isotropic diffusion weighting with a single or multiple spin-echo pulse sequence with reduced echo times compared to the present known methods giving higher signal-to-noise ratio and enabling isotropic diffusion weighting on systems with shorter characteristic length scale of micro-anisotropy. An important characteristic of the new protocol is that it can be implemented with standard diffusion MR(I) equipment with reduced or comparable demands on the gradient system hardware compared to the present methods.

The isotropic weighting protocol disclosed herein can be used to obtain data with isotropic diffusion weighting and thus determine the mean diffusivity with high precision (high signal to noise) at minimum scan times. The protocol can be used as a building block, e.g. isotropic diffusion filter, of different NMR or MRI experiments. For example, it could be used in molecular exchange measurements (FEXSY, FEXI) as a low pass diffusion filter. It can also be used within multi-dimensional (2D, 3D . . . ) correlation experiments to achieve isotropic diffusion weighting or signal filtering. For example, the protocol could be used in diffusion-diffusion or diffusion-relaxation correlation experiments, where isotropic and non-isotropic diffusion contributions are correlated and analysed by an inverse Laplace transform to yield information about degree of anisotropy for different diffusion components (contributions). The protocol could also be used in combination with other NMR or MRI methods. For example, the protocol could be combined with the diffusion tensor and/or diffusion kurtosis measurement to provide additional information about morphology and micro-anisotropy as well as information about anisotropic orientation dispersion. The protocol can be used to facilitate and strengthen the interpretation of diffusion tensor and diffusion kurtosis measurements in vivo. For example, the protocol can provide information on the degree of anisotropy and on multi-exponential signal decays detected in kurtosis tensor measurements by attributing kurtosis to different isotropic and/or anisotropic diffusion contributions.

BRIEF DESCRIPTION OF THE DRAWINGS

FIGS. 1A-D to 6A-D show examples of different gradient modulation schemes for isotropic diffusion weighting according to the present invention. Insets A depict components of the normalized dephasing vector, $q_x/|q|$ (dashed line), $q_y/|q|$ (dotted line) and $q_z/|q|$ (dash dotted line) and the normalized magnitude of the dephasing vector, F(t) (solid line). Insets B depict components of the normalized effective gradient vector, $g_x/|g|$ (dashed line), $g_y/|g|$ (dotted line) and $g_z/|g|$ (dash dotted line). Insets C depict time dependence of the azimuth angle. Insets D depict the evolution of the anisotropic diffusion weighting terms (16) as a function of time; the first term in Eq. (16) is shown as a dotted line, the second term is shown as a dashed dotted line, the third term as a solid line and the fourth term is shown as a dashed line.

FIG. 7A-C show schematic representations of signal decays vs. b for isotropic (dashed line) and non-isotropic (solid line) diffusion weighting for different types of materials. The inset A depicts signal attenuation curves in case of anisotropic materials with 1D or 2D curvilinear diffusion. The attenuation curves are multi-exponential for non-isotropic diffusion weighting, while they are mono-exponential for isotropic diffusion weighting. The deviation between the attenuation curves for isotropic and non-isotropic diffusion weighting provides a measure of anisotropy. The inset B depicts an example of isotropic material with several apparent diffusion contributions resulting in identical and multi-exponential signal attenuation curves for isotropic and non-isotropic diffusion weighting. The inset C depicts an example of material with a mixture of isotropic and anisotropic components resulting in multi-exponential signal decays for both isotropic and non-isotropic diffusion weighting, while the deviation between the attenuation curves for isotropic and non-isotropic diffusion weighting provides a measure of anisotropy.

FIG. 8A-C show experimental results with analysis for different types of materials. Experimental results for isotropic (circles) and for non-isotropic (crosses) diffusion weighting are shown in all the insets. Experimental results and analysis are shown for a sample with free isotropic diffusion (inset A), for a sample with restricted isotropic diffusion (inset B) and for a sample with high degree of anisotropy (inset C).

DESCRIPTION; BACKGROUND AND SOME SPECIFIC EMBODIMENTS OF THE PRESENT INVENTION

Figure 9A:
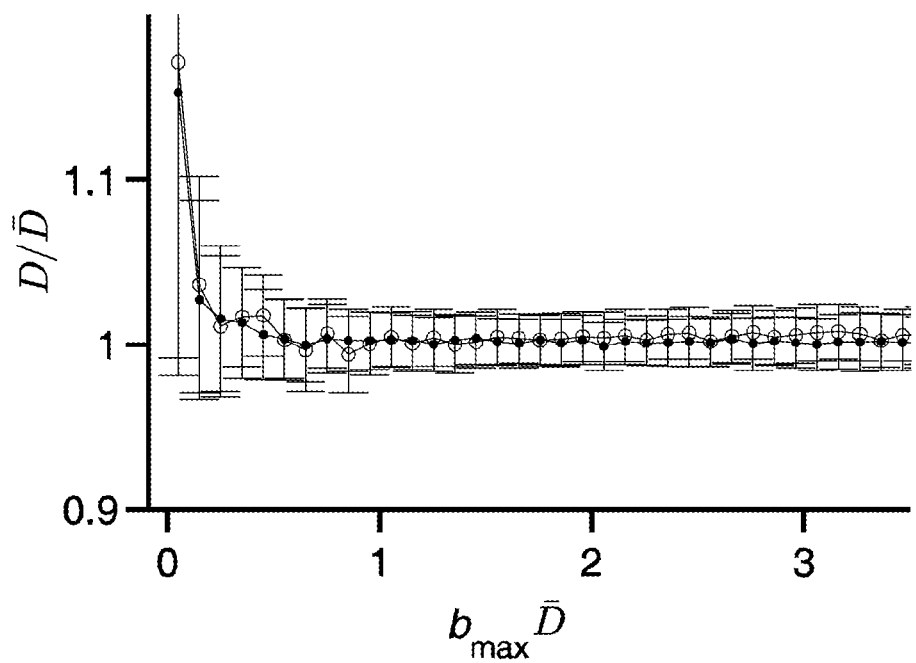
FIGS. 9A and 9B show a Monte-Carlo error analysis for the investigation of systematic deviations and precision as a function of the range of diffusion weighting b for estimating the degree of micro-anisotropy with the disclosed analytical method.

Assuming that spin diffusion in a microscopically anisotropic system can locally be considered a Gaussian process and therefore fully described by the diffusion tensor D(r), the evolution of the complex transverse magnetization m(r,t) during a diffusion encoding experiment is given by the Bloch-Torrey equation. Note that the Bloch-Torrey equation applies for arbitrary diffusion encoding schemes, e.g. pulse gradient spin-echo (PGSE), pulse gradient stimulated echo (PGSTE) and other modulated gradient spin-echo (MGSE) schemes. Assuming uniform spin density and neglecting relaxation, the magnetization evolution is given by $$\frac{\partial m(r, t)}{\partial t} = -i\gamma g(t) \cdot rm(r, t) + \nabla \cdot [D(r) \cdot \nabla m(r, t)], \quad (1)$$

where $\gamma$ is the gyromagnetic ratio and g(t) is the time dependent effective magnetic field gradient vector. The NMR signal is proportional to the macroscopic transverse magnetization $$M(t) = \frac{1}{V} \int_V m(r,t) dr. \quad (2)$$

If during the experiment each spin is confined to a domain characterized by a unique diffusion tensor D, the macroscopic magnetization is a superposition of contributions from all the domains with different D. Evolution of each macroscopic magnetization contribution can thus be obtained by solving Eqs. (1, 2) with a constant and uniform D. The signal magnitude contribution at the echo time $t_E$ is given by $$I(t_E) = I_0 \exp\left(-\int_0^{t_E} q^T(t) \cdot D \cdot q(t) dt\right) \quad (3)$$

$$= I_0 \exp\left(-q^2 \int_0^{t_E} F(t)^2 \hat{q}^T(t) \cdot D \cdot \hat{q}(t) dt\right),$$

where $I_0$ is the signal without diffusion encoding, g=0, and q(t) is the time-dependent dephasing vector $$q(t) = \gamma \int_0^t g(t') dt' = qF(t)\hat{q}(t), \quad (4)$$

defined for the interval $0 < t < t_E$. The dephasing vector in Eqs. (3) and (4) is expressed in terms of its maximum magnitude q, the time-dependent normalized magnitude $|F(t)| \le 1$ and a time-dependent unit direction vector $\hat{q}(t)$. Note that in spin-echo experiments, the effective gradient g(t) comprises the effect of gradient magnitude reversal after each odd 180° radio frequency (RF) pulse in the sequence. Eq. (3) assumes that the condition for the echo formation $q(t_E)=0$ is fulfilled, which implies $F(t_E)=0$. In general there might be several echoes during an NMR pulse sequence.

The echo magnitude (3) can be rewritten in terms of the diffusion weighting matrix, $$b = q^2 \int_0^{t_E} F(t)^2 \hat{q}(t) \cdot \hat{q}^T(t) dt, \text{ as} \quad (5)$$

$$I(t_E) = I_0 \exp(-b:D) = I_0 \exp\left(-\sum_i \sum_j b_{ij} D_{ij}\right). \quad (6)$$

Integral of the time-dependent waveform $F(t)^2$ defines the effective diffusion time, $t_d$, for an arbitrary diffusion encoding scheme in a spin-echo experiment $$t_d = \int_0^{t_E} F(t)^2 dt. \quad (7)$$

In the following we will demonstrate that even for a single echo sequence, gradient modulations g(t) can be designed to yield isotropic diffusion weighting, invariant under rotation of D, i.e. the echo attenuation is proportional to the isotropic mean diffusivity, $$\overline{D} = tr(D)/3 = (D_{xx} + D_{yy} + D_{zz})/3. \quad (8)$$

In view of what is disclosed above, according to one specific embodiment of the present invention, the isotropic diffusion weighting is invariant under rotation of the diffusion tensor D.

According to the present invention, one is looking for such forms of dephasing vectors $F(t)\hat{q}(t)$, for which $$\int_0^{t_E} F(t)^2 \hat{q}^T(t) \cdot D \cdot \hat{q}(t) dt = t_d \overline{D} \quad (9)$$

is invariant under rotation of D. If diffusion tenor D is expressed as a sum of its isotropic contribution, $\overline{D}I$, where I is the identity matrix, and the anisotropic contribution, i.e. the deviatoric tensor $D^A$, so that $D = \overline{D}I + D^A$, the isotropic diffusion weighing is achieved when the condition $$\int_0^{t_E} F(t)^2 \hat{q}^T(t) \cdot D^A \cdot \hat{q}(t) dt = 0 \quad (10)$$

is fulfilled.

In spherical coordinates, the unit vector $\hat{q}(t)$ is expressed by the inclination $\zeta$ and azimuth angle $\psi$ as $$\hat{q}^T(t) = \{\hat{q}_x(t), \hat{q}_y(t), \hat{q}_z(t)\} = \{\sin\zeta(t)\cos\psi(t), \sin\zeta(t)\sin\psi(t), \cos\zeta(t)\}. \quad (11)$$

The symmetry of the diffusion tensor, $D=D^T$, gives $$\hat{q}^T \cdot D \cdot \hat{q} = \hat{q}_x^2 D_{xx} + \hat{q}_y^2 D_{yy} + \hat{q}_z^2 D_{zz} + 2\hat{q}_x \hat{q}_y D_{xy} + 2\hat{q}_x \hat{q}_z D_{xz} + 2\hat{q}_y \hat{q}_z D_{yz} \quad (12)$$

or expressed in spherical coordinates as $$\hat{q}^T \cdot D \cdot \hat{q} = \sin^2\zeta \cos^2\psi D_{xx} + \sin^2\zeta \sin^2\psi D_{yy} + \cos^2\zeta D_{zz} + 2\sin\zeta\cos\psi\sin\zeta\sin\psi D_{xy} + 2\sin\zeta\cos\psi\cos\zeta D_{xz} + 2\sin\zeta\sin\psi\cos\zeta D_{yz}. \quad (13)$$

Equation (13) can be rearranged to $$\hat{q} \cdot D \cdot \hat{q} = \overline{D} + \frac{3\cos^2\zeta - 1}{2}(D_{zz} - \overline{D}) + \quad (14)$$

$$\sin^2\zeta\left[\frac{D_{xx} - D_{yy}}{2}\cos(2\psi) + D_{xy}\sin(2\psi)\right] +$$

$$\sin(2\zeta)(D_{xz}\cos\psi + D_{yz}\sin\psi).$$

The first term in Eq. (14) is the mean diffusivity, while the remaining terms are time-dependent through the angles at) and $\zeta(t)$ and $\psi(t)$ which define the direction of the dephasing vector (4). Furthermore, the second term in Eq. (14) is independent of $\psi$, while the third and the forth terms are harmonic functions of $\psi$ and $2\psi$, respectively (compare with Eq. (4) in [13]). To obtain isotropic diffusion weighting, expressed by condition in Eq. (9), the corresponding integrals of the second, third and fourth terms in Eq. (14) must vanish. The condition for the second term of Eq. (14) to vanish upon integration leads to one possible solution for the angle $\zeta(t)$, i.e. the time-independent "magic angle"

$$\zeta_m = a\cos(1/\sqrt{3}). \quad (15)$$

By taking into account constant $\zeta_m$, the condition for the third and the fourth term in Eq. (14) to vanish upon integration is given by $$\int_0^{t_E} F(t)^2 \cos[2\psi(t)]dt = 0 \qquad (16)$$

$$\int_0^{t_E} F(t)^2 \sin[2\psi(t)]dt = 0$$

$$\int_0^{t_E} F(t)^2 \cos[\psi(t)]dt = 0$$

$$\int_0^{t_E} F(t)^2 \sin[\psi(t)]dt = 0.$$

Conditions (16) can be rewritten in a more compact complex form as $$\int_0^{t_E} F(t)^2 \exp[ik\psi(t)]dt = 0, \qquad (17)$$

which must be satisfied for k=1, 2. By introducing the rate $\tau(t)=F(t)^2$, the integral (17) can be expressed with the new variable $\tau$ as $$\int_0^{t_d} \exp[ik\psi(\tau)]d\tau = 0. \qquad (18)$$

Note that the upper integration boundary moved from $t_E$ to $t_d$. The condition (18) is satisfied when the period of the exponential is $t_d$, thus a solution for the azimuth angle is $$\psi(\tau) = \psi(0) + \frac{2\pi}{t_d} n\tau, \qquad (19)$$

for any integer n other than 0. The time dependence of the azimuth angle is finally given by $$\psi(t) = \psi(0) + \frac{2\pi n}{t_d} \int_0^t F(t')^2 dt'. \qquad (20)$$

The isotropic diffusion weighting scheme is thus determined by the dephasing vector q(t) with a normalized magnitude F(t) and a continuous orientation sweep through the angles $\zeta_m$ (15) and $\psi(t)$ (20). Note that since the isotropic weighting is invariant upon rotation of D, orientation of the vector q(t) and thus also orientation of the effective gradient g(t) can be arbitrarily offset relative to the laboratory frame in order to best suit the particular experimental conditions.

As understood from above, according to yet another specific embodiment, the isotropic diffusion weighting is achieved by a continuous sweep of the time-dependent dephasing vector q(t) where the azimuth angle $\psi(t)$ and the magnitude thereof is a continuous function of time so that the time-dependent dephasing vector q(t) spans an entire range of orientations parallel to a right circular conical surface and so that the orientation of the time-dependent dephasing vector q(t) at time 0 is identical to the orientation at time $t_E$. Furthermore, according to yet another embodiment, the inclination $\zeta$ is chosen to be a constant, time-independent value, i.e. the so called magic angle, such that $\zeta=\zeta_m=a\cos(1/\sqrt{3})$. It should be noted that the method according to the present invention may also be performed so that $\zeta$ is chosen to be time-dependent, as far as condition (10) is fulfilled, however, this is not a preferred implementation.

What is disclosed above implies that according to one specific embodiment of the present invention, the orientation of the dephasing vector, in the Cartesian coordinate system during the diffusion weighting sequence, spans the entire range of orientations parallel to the right circular conical surface with the aperture of the cone of $2*\zeta_m$ (double magic angle) and the orientation of the dephasing vector at time 0 is identical to the orientation of the dephasing vector at time $t_E$, i.e. $\psi(t_E)-\psi(0)=2*\pi*n$, where n is an integer (positive or negative, however not 0) and the absolute magnitude of the dephasing vector, q*F(t), is zero at time 0 and at time $t_E$. Therefore, according to one specific embodiment, the time-dependent normalized magnitude F(t) of the dephasing vector is |F(t)|≤1 during an echo time $t_E$ from t=0 to t=$t_E$ and the orientation of the dephasing vector at time 0 is identical to the orientation of the dephasing vector at time $t_E$.

With reference to what is disclosed above it should be said that the concept of the magic angle is used in other types of methods in MR today. For instance in US2008116889 there is disclosed a method for magnetic resonance analysis or in fact MRI spectroscopy suggesting a magic angle technique. The turning around the magic angle as disclosed in US2008116889 is required to achieve higher spectroscopic resolution (reduce anisotropic susceptibility broadening). The method does no relate to diffusion weighting. According to the present invention the dephasing vector may be turned around the magic angle to achieve isotropic diffusion weighting, and is hence not related to turning the magnetic field or sample around the magic angle as described in US2008116889.

According to the present invention, the isotropic weighting can also be achieved by q-modulations with discrete steps in azimuth angle $\psi$, providing q(t) vector steps through at least four orientations with unique values of $e^{i\psi}$, such that $\psi$ modulus $2\pi$ are equally spaced values. Choice of the consecutive order and duration of the time intervals during which $\psi$ is constant is arbitrary, provided that the magnitude F(t) is adjusted to meet the condition for isotropic weighing (10, 16).

Specific Implementations and Embodiments of the Present Invention

The pulsed gradient spin-echo (PGSE) sequence with short pulses offers a simplest implementation of the isotropic weighting scheme according to the present invention. In PGSE, the short gradient pulses at times approximately 0 and $t_E$ cause the magnitude of the dephasing vector to instantaneously acquire its maximum value approximately at time 0 and vanish at time $t_E$. The normalized magnitude is in this case given simply by F(t)=1 in the interval 0<t<$t_E$ and 0 otherwise, providing $t_d$=$t_E$. A simplest choice for the azimuth angle (20) is the one with n=1 and $\psi(0)$=0, thus $$\psi(t) = \frac{2\pi t}{t_E}. \qquad (21)$$

The dephasing vector is given by $$q^T(t) = q\left\{\sqrt{\frac{2}{3}}\cos\left(\frac{2\pi t}{t_E}\right), \sqrt{\frac{2}{3}}\sin\left(\frac{2\pi t}{t_E}\right), \sqrt{\frac{1}{3}}\right\}. \quad (22)$$

The corresponding effective gradient, calculated from $$g^T(t) = \frac{1}{\gamma}\frac{d}{dt}q^T(t) \quad (23)$$

is $$g^T(t) = \frac{q}{\gamma}[\delta(0) - \delta(t_E)]\left\{\sqrt{\frac{2}{3}}, 0, \sqrt{\frac{1}{3}}\right\} + \sqrt{\frac{2}{3}}\frac{2\pi}{t_E}\frac{q}{\gamma}\left\{-\sin\left(\frac{2\pi t}{t_E}\right), \cos\left(\frac{2\pi t}{t_E}\right), 0\right\}. \quad (24)$$

Here δ(t) is the Dirac delta function. Rotation around the y-axis by a tan(√2) yields $$g^T(t) = \frac{q}{\gamma}[\delta(0) - \delta(t_E)]\{0, 0, 1\} + \sqrt{\frac{2}{3}}\frac{2\pi}{t_E}\frac{q}{\gamma}\left\{-\sqrt{\frac{1}{3}}\sin\left(\frac{2\pi t}{t_E}\right), \cos\left(\frac{2\pi t}{t_E}\right), -\sqrt{\frac{2}{3}}\sin\left(\frac{2\pi t}{t_E}\right)\right\}. \quad (25)$$

The effective gradient in Eqs. (24, 25) can conceptually be separated as the sum of two terms, $$g(t) = g_{PGSE}(t) + g_{iso}(t). \quad (26)$$

The first term, $g_{PGSE}$, represents the effective gradient in a regular PGSE two pulse sequence, while the second term, $g_{iso}$, might be called the "iso-pulse" since it is the effective gradient modulation which can be added to achieve isotropic weighting.

As may be seen from above, according to one specific embodiment of the present invention, the method is performed in a single shot, in which the latter should be understood to imply a single MR excitation.

Analysis

Below there will be disclosed a suggested analysis method which may be performed subsequent to the method disclosed above.

Fractional anisotropy (FA) is a well-established measure of anisotropy in diffusion MRI. FA is expressed as an invariant of the diffusion tensor with eigenvalues $\lambda_1$, $\lambda_2$, and $\lambda_3$, $$FA = \sqrt{\frac{(\lambda_1 - \lambda_2)^2 + (\lambda_1 - \lambda_3)^2 + (\lambda_2 - \lambda_3)^2}{2(\lambda_1^2 + \lambda_2^2 + \lambda_3^2)}}. \quad (27)$$

In typical diffusion MRI experiments, only a voxel average anisotropy can be detected. The sub-voxel microscopic anisotropy is often averaged out by a random distribution of main diffusion axis. Here we introduce a novel parameter for quantifying microscopic anisotropy and show how it can be determined by diffusion NMR.

Information about the degree of micro-anisotropy can be obtained from comparison of the echo-attenuation curves, $E(b) = I(b)/I_0$, with and without the isotropic weighting.

Multi-exponential echo attenuation is commonly observed in diffusion experiments. The multi exponential attenuation might be due to isotropic diffusion contributions, e.g. restricted diffusion with non-Gaussian diffusion, as well as due to the presence of multiple anisotropic domains with varying orientation of main diffusion axis. The inverse Laplace transform of E(b) provides a distribution of apparent diffusion coefficients P(D), with possibly overlapping isotropic and anisotropic contributions. However, in isotropically weighed diffusion experiments, the deviation from mono-exponential attenuation is expected to originate mainly from isotropic contributions.

In practice, the diffusion weighting b is often limited to a low-b regime, where only an initial deviation from mono-exponential attenuation may be observed. Such behaviour may be quantified in terms of the kurtosis coefficient K (Jensen, J. H., and Helpern, J. A. (2010). MRI quantification of non-Gaussian water diffusion by kurtosis analysis. NMR Biomed 23, 698-710.), $$\ln E = -\overline{D}b + \frac{\overline{D}^2 K}{6}b^2 - \ldots \quad (28)$$

The second term in Eq. (28) can be expressed by the second central moment of the distribution P(D).

Provided that P(D) is normalized, $$\int_0^\infty P(D)dD = 1, \quad (29)$$

the normalized echo signal is given by the Laplace transform $$E(b) = \int_0^\infty P(D)e^{-bD}dD. \quad (30)$$

The distribution P(D) is completely determined by the mean value $$\overline{D} = \int_0^\infty DP(D)dD \quad (31)$$

and by the central moments $$\mu_m = \int_0^\infty (D - \overline{D})^m P(D)dD. \quad (32)$$

The second central moment gives the variance, $\mu_2 = \sigma^2$, while the third central moment, $\mu_3$, gives the skewness or asymmetry of the distribution P(D). On the other hand, the echo intensity can be expressed as a cumulant expansion (Frisken, B. (2001). Revisiting the method of cumulants for the analysis of dynamic light-scattering data. Appl Optics 40) by $$\ln E = -\overline{D}b + \frac{\mu_2}{2}b^2 - \ldots \quad (33)$$

The first-order deviation from the mono-exponential decay is thus given by the variance of P(D).

Assuming diffusion tensors with axial symmetry, i.e. $\lambda_1 = D_\parallel$ and $\lambda_2 = \lambda_3 = D_\perp$, and an isotropic distribution of orientation of the tensor's main diffusion axis, the echo-signal E(b) and the corresponding distribution P(D) can be written in a simple form. In case of the single PGSE experiment, using a single diffusion encoding direction, the distribution is given by $$P(D) = \frac{1}{2\sqrt{(D - D_\perp)(D_\parallel - D_\perp)}}, \quad (34)$$

with the mean and variance, $$\overline{D} = \frac{D_\parallel + 2D_\perp}{3} \quad (35)$$

and $$\mu_2 = \frac{4}{45}(D_\parallel - D_\perp)^2.$$

The echo-attenuation for the single PGSE is given by $$E(b) = \frac{\sqrt{\pi}}{2} \frac{e^{-bD_\perp}}{\sqrt{b(D_\parallel + D_\perp)}} \text{erf}\left(\sqrt{b(D_\parallel + D_\perp)}\right). \quad (36)$$

For a double PGSE with orthogonal encoding gradients, the distribution P(D) is given by $$P(D) = \frac{1}{\sqrt{(D_\parallel + D_\perp - 2D)(D_\parallel - D_\perp)}}, \quad (37)$$

with the same mean value as for the single PGSE but with a reduced variance, $$\mu_2 = \frac{1}{45}(D_\perp - D_\parallel)^2. \quad (38)$$

As in the single PGSE, also in double PGSE the echo-attenuation exhibits multi-component decay, $$E(b) = \frac{\sqrt{\pi}}{2} \frac{e^{-b\frac{D_\perp + D_\parallel}{2}}}{\sqrt{b\frac{D_\perp - D_\parallel}{2}}} \text{erf}\left(\sqrt{b\frac{D_\perp - D_\parallel}{2}}\right). \quad (39)$$

For randomly oriented anisotropic domains, the non-isotropic diffusion weighting results in a relatively broad distribution of diffusion coefficients, although reduced four-fold when measured with a double PGSE compared to the single PGSE. On the other hand the isotropic weighting results in $$P(D) = \delta\left(D - \frac{D_\parallel + 2D_\perp}{3}\right), \quad (40)$$

with $$\mu_2 = 0 \quad (41)$$

and a mono-exponential signal decay $$E(b) = e^{-b\overline{D}}. \quad (42)$$

The variance $\mu_2$ could be estimated by applying a function of the form (33) to fitting the echo attenuation data. However, in case of randomly oriented anisotropic domains, the convergence of the cumulant expansion of (36) is slow, thus several cumulants may be needed to adequately describe the echo attenuation (36). Alternatively, the distribution (34) may be approximated with the Gamma distribution $$P(D) = D^{\alpha-1} \frac{e^{-D/\beta}}{\Gamma(\alpha)\beta^\alpha}, \quad (43)$$

where $\alpha$ is known as the shape parameter and $\beta$ is known as the scale parameter. For the Gamma distribution, the mean diffusivity is given by $\overline{D} = \alpha \cdot \beta$, while the variance is given by $\mu_2 = \alpha \cdot \beta^2$. The Gamma distribution is an efficient fitting function. With the two parameters it can capture a wide range of diffusion distributions, with both isotropic as well as anisotropic contributions. Conveniently, the Laplace transform of the Gamma function takes a simple analytical form, $$E(b) = (1 + b\beta)^{-\alpha} \quad (44)$$

$$= \left(1 + b\frac{\mu_2}{\overline{D}}\right)^{-\frac{\overline{D}^2}{\mu_2}}.$$

The variance, $\mu_2^{iso}$, obtained by fitting the function (44) to the isotropic diffusion weighted echo-decay is related to the isotropic diffusion contributions, since the variance is expected to vanish with isotropic weighting in a pure microscopically anisotropic system (see Eq. 41). The same fitting procedure on non-isotropically weighted data will yield the variance $\mu_2$ due to both isotropic and anisotropic contributions. The difference $\mu_2 - \mu_2^{iso}$ vanishes when all diffusion contributions are isotropic and therefore provides a measure of micro-anisotropy. The mean diffusivity $\overline{D}$, on the other hand, is expected to be identical for both isotropically and non-isotropically weighted data. The difference $\mu_2 - \mu_2^{iso}$ is thus obtained by using the $\mu_2^{iso}$ and $\mu_2$ as free fit parameters when Eq. (44) is fitted to isotropically and non-isotropically weighted data sets, respectively, while a common parameter $\overline{D}$ is used to fit both data sets.

The difference $\mu_2 - \mu_2^{iso}$ along with $\overline{D}$ provide a novel measure for the microscopic fractional anisotropy (µFA) as $$\mu FA = \sqrt{\frac{3}{2}} \sqrt{\frac{\mu_2 - \mu_2^{iso}}{\mu_2 - \mu_2^{iso} + 2\overline{D}^2/5}}. \quad (45)$$

The µFA is defined so that the µFA values correspond to the values of the well-established FA when diffusion is locally purely anisotropic and determined by randomly oriented axially symmetric diffusion tensors with identical eigenvalues. Eq. (45) is obtained by setting µFA=FA (27), assuming $\mu_2 - \mu_2^{iso} = \mu_2$ and expressing the eigenvalues $D_\parallel$ and $D_\perp$ in terms of $\overline{D}$ and $\mu_2$ (see Eq. 35). In the case of a one-dimensional curvilinear diffusion, when $D_\parallel \gg D_\perp$, µFA=FA=1 and in the case of two-dimensional curvilinear diffusion, when $D_\parallel \ll D_\perp$, µFA=FA=1/$\sqrt{2}$.

The difference $\mu_2-\mu_2^{iso}$ in Eq. (45) ensures that the micro-anisotropy can be quantified even when isotropic diffusion components are present. Isotropic restrictions, e.g. spherical cells, characterised by non-Gaussian restricted diffusion, are expected to cause a relative increase of both $\mu_2$ and $\mu_2-\mu_2^{iso}$ by the same amount, thus providing the difference $\mu_2-\mu_2^{iso}$ independent of the amount of isotropic contributions. The amount of non-Gaussian contributions could be quantified for example as the ratio $\sqrt{\mu_2^{iso}}/\overline{D}$ For anisotropic diffusion with finite orientation dispersion, i.e. when local diffusion tensors are not completely randomly oriented, the $\overline{D}$ and $\mu_2-\mu_2^{iso}$ are expected to depend on the gradient orientation in the non-isotropic diffusion weighting experiment. Furthermore, variation of the apparent diffusion coefficient (ADC), i.e. volume weighted average diffusivity, dependent on the gradient orientation and given by the initial echo decay of the non-isotropic diffusion weighting experiment, may indicate a finite orientation dispersion. Non-isotropic weighting experiment performed in several directions, similar to the diffusion tensor and diffusion kurtosis tensor measurements, performed with a range of b values to detect possibly multi-exponential decays, combined with the isotropic weighting experiment, is thus expected to yield additional information about micro-anisotropy as well as information related to the orientation dispersion of anisotropic domains.

Eq. (44) could be expanded by additional terms in cases where this is appropriate. For example, the effects of a distinct signal contribution by the cerebrospinal fluid (CSF) in brain could be described by adding a mono-exponential term with the isotropic CSF diffusivity $D_1$ to Eq. (44), $$E(b) = fe^{-bD_1} + (1-f)\left(1+b\frac{\mu_2}{\overline{D}}\right)^{-\frac{\overline{D}^2}{\mu_2}}, \quad (46)$$

where f is the fraction of the additional signal contribution. Eq. (46) could be used instead of Eq. (44) to fit the experimental data.

When an extended fitting model described in Eq. (46) is applied, then the mean diffusivity, $\overline{D}$, the additional diffusion contribution (f) and the diffusivity of the additional contribution ($D_1$) are constrained to be equal for the isotropic and the non-isotropic diffusion weighted data.

The method may involve the use of additional terms in Eq. (44), such as Eq. (46), applied to the analysis described in the above paragraphs. Eq. (46) comprises two additional parameters, i.e. fraction of the additional diffusion contribution (f) and diffusivity of the additional contribution ($D_1$). One such example may be the analysis of data from the human brain, where the additional term in Eq. (46) could be assigned to the signal from the cerebrospinal fluid (CSF). The parameter $\overline{D}$ in Eq. (46) would in this case be assigned to the mean diffusivity in tissue while the parameter $D_1$ would be assigned to the diffusivity of the CSF. The isotropic diffusion weighting could thus be used to obtain the mean diffusivity in the brain tissue without the contribution of the CSF.

In addition, valuable information about anisotropy may be obtained from the ratio of the non-isotropically and the isotropically weighted signal or their logarithms. For example, the ratio of the non-isotropically and the isotropically weighted signals at intermediate b-values, might be used to estimate the difference between the radial ($D_\perp$) and the axial ($D_\parallel$) diffusivity in the human brain tissue due to the diffusion restriction effect by the axons. Extracting the information about microscopic anisotropy from the ratio of the signals might be advantageous, because the isotropic components with high diffusivity, e.g. due to the CSF, are suppressed at higher b-values. Such a signal ratio or any parameters derived from it might be used for generating parameter maps in MRI or for generating MR image contrast.

DETAILED DESCRIPTION OF THE DRAWINGS

FIGS. 1 to 6 show examples of different gradient modulation schemes for isotropic diffusion weighting according to the present invention. In all of the FIGS. 1-6 the following is valid: A) Normalized dephasing magnitude F(t) (solid line), components of the normalized dephasing vector, $q_x/|q|$ (dashed line), $q_y/|q|$ (dotted line) and $q_z/|q|$ (dash dotted line). B) Azimuth angle $\psi(t)$. C) Components of the normalized effective gradient vector, $g_x/|g|$ (dashed line), $g_y/|g|$ (dotted line) and $g_z/|g|$ (dash dotted line). Note that if a 180° RF pulse is used at $t=t_E/2$, the actual hardware generated gradients are inverted compared to the ones shown in C) for times $t>t_E/2$. D) The anisotropic weighting contributions from Eq. (16) as a function of time; the first term in Eq. (16) is shown as a dotted line, the second term as a dashed dotted line, the third terms as a solid line and the fourth term is shown as a dashed line. The different presented gradient modulation schemes were constructed by first choosing the dephasing magnitude modulation, F(t), then calculating the corresponding time-dependent azimuth angle, $\psi(t)$, followed by the calculation of the different components of the dephasing and gradient vectors. Note that, in this particular example, due to the choice of the time independent magic angle $\zeta_m$ and the orientation of the laboratory axis, the z-components of the effective gradient vector and the dephasing vector are proportional to $|g(t)|$ and F(t), respectively. This suggests that equivalent diffusion weighting values, b, can be achieved in an isotropic diffusion weighting experiment, utilizing gradients in all the three directions, and in a non-isotropic diffusion weighting experiment, utilizing only gradients in z-direction, if the z-gradient for non-isotropic diffusion weighting is larger than the z-gradient for isotropic diffusion weighting by factor $\sqrt{3}$.

The first example depicts the PGSE sequence with approximately constant F(t)=1, i.e. short z-gradient pulses ($g_z/|g|$) at the beginning and at the end of the diffusion encoding interval. The gradient sequence is augmented by a sinusoidal gradient modulation in x-direction and with a cosine modulation in y-direction to achieve isotropic diffusion weighting. Note that, as in typical PGSE diffusion experiments, the non-isotropic diffusion weighting is achieved when x and y gradients are not active. In this example, the gradient modulations are identical in the intervals $0<t<t_E/2$ and $t_E/2<t<t_E$, when a 180° refocusing RF pulse is used, which is a preferred implementation for many applications, e.g. to achieve spectroscopic resolution. This may be advantageous due to possible asymmetries in gradient generating equipment. However, the use of short gradient pulses as well as the need to quickly increase the cosine gradient component to its maximum value following excitation and following the possible application of a 180° RF pulse, as well as quickly decrease its value to zero before a possible application of a 180° RF pulse, may be a disadvantageous implementation for some applications.

The second example may be viewed as a PGSE with long gradient pulses in z-direction or a spin-echo experiment in a constant z-gradient (which may be provided by a stray field of the magnet) augmented with the gradient modulation in x and y directions for isotropic diffusion weighting. Similarly as in the first example, the possible need for fast rising and vanishing of some of the gradient components may be disadvantageous also in this case. Furthermore, unlike in the first example, modulations of some gradient components are not identical in the intervals $0<t<t_E/2$ and $t_E/2<t<t_E$.

In relation to the description above and below it should be mentioned that also multi-echo variants of course are possible according to the present invention. Such may in some cases be beneficial for flow/motion compensation and for compensation of possible asymmetry in gradient generating equipment.

In examples 3-6, we make use of harmonic gradient modulations for all gradient and dephasing components. These examples may be advantageous compared to the first two examples by using a more gradual variation in the dephasing magnitude. However, these examples do suffer from non-identical modulations of some gradient components in the intervals $0<t<t_E/2$ and $t_E/2<t<t_E$. While in examples 3-5 there may be the need for fast rising and vanishing of some of the gradient components immediately after and before the application of the RF pulses, the situation is more favourable in the sixth example, since all the gradient components conveniently vanish at times $0$, $t_E/2$ and $t_E$. As my be understood from above, according to one specific embodiment of the present invention, the time-dependent normalized magnitude F(t) is chosen as a harmonic function of time. It should, however, be noted that this is not a must, as may be seen in FIGS. 1 and 2, where this is not the case.

In FIG. 7A-C there is shown a schematic representation of signal decays vs. b for isotropic and non-isotropic diffusion weighting for different types of materials. In FIG. 7 the following is valid: A) Solid lines represent decays in a non-isotropic diffusion weighting experiment for 1D and 2D curvilinear diffusion (e.g. diffusion in reversed hexagonal phase H2 (tubes) and in lamellarphase Lα (planes), respectively). Dashed lines are the corresponding decays with isotropic diffusion weighting. The initial decay ($\overline{D}$) is identical for the isotropic weighting as for the non-isotropic diffusion weighting. B) The decay for a system with 70% free isotropic diffusion and 30% restricted isotropic diffusion. In this case the isotropic and non-isotropic diffusion weighting result in identical signal decays in the entire b range. C) Decays for a system with 70% anisotropic diffusion (2D) and 30% restricted isotropic diffusion. Solid line corresponds to the non-isotropic diffusion weighting while the dashed line corresponds to the isotropic diffusion weighting. The initial decays are identical for the isotropic and for the non-isotropic diffusion weighting, while the deviation between the decays at higher b values reveals the degree of anisotropy.

In FIG. 8A-C are shown experimental results with analysis of micro-anisotropy for different types of materials. Shown are normalized signal decays vs. $b\overline{D}$ for isotropic (circles) and non-isotropic (crosses) diffusion weighting. Solid lines represent optimal fits of Eq. (44) to the experimental data, with constraint of equal initial decays (shown as dashed lines) for isotropic and non-isotropic weighted data. All experiments were performed at 25° C. In all experiments, signal intensities were obtained by integration of the water peak. A) free water; data from the isotropic and non-isotropic diffusion weighting overlap and give rise to mono-exponential signal decays. The analysis gives $\overline{D}=2.2\times10^{-9}$ m²/s and μLFA=0. B) Suspension of yeast cells from baker's yeast (Jästbolaget AB, Sweden) in tap water with restricted water diffusion; data from the isotropic and non-isotropic diffusion weighting overlap and give rise to multi-exponential signal decays. The analysis gives $\overline{D}=1.4\times10^{-9}$ m²/s and μFA=0. C) Diffusion of water in a liquid crystal material composed by the Pluronic surfactant E5P68E6 with very high microscopic anisotropy, corresponding to a reverse hexagonal phase; data from the isotropic and non-isotropic diffusion weighting diverge at higher b-values and give rise to multi-exponential signal decay in case of the non-isotropic diffusion weighting and mono-exponential signal decay in case of the isotropic diffusion weighting. The analysis gives $\overline{D}=4.8\times10^{-10}$ m²/s and μFA=1.0.

Figure 9B:
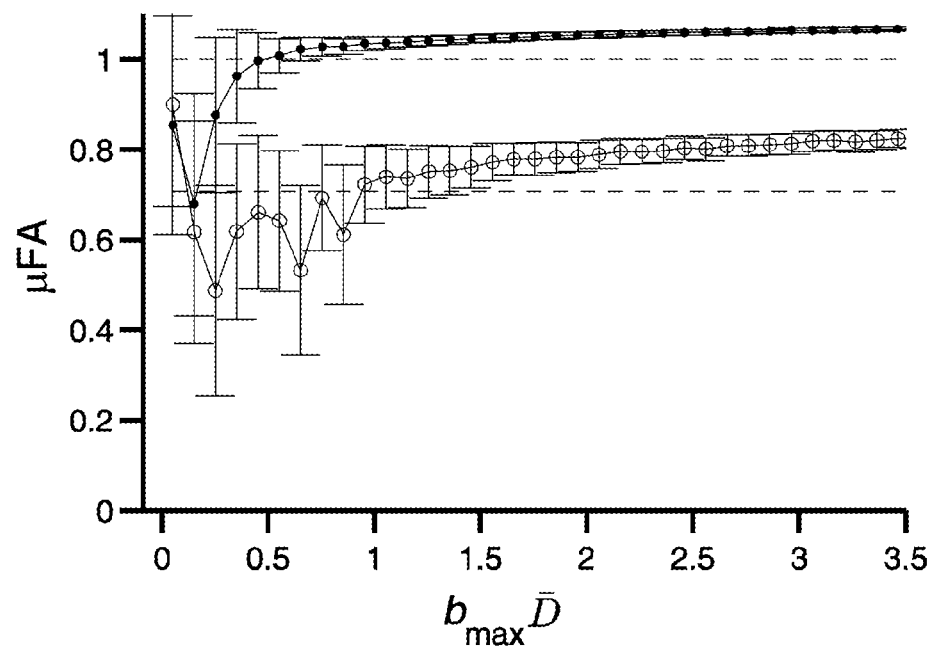

In FIGS. 9A and 9B, the results of the Monte-Carlo error analysis show systematic deviations and precision of the $\overline{D}$ (A) and μFA (B) parameters estimated for the 1D (dots) and 2D (circles) curvilinear diffusion according to what has been disclosed above. The ratio of the estimated mean diffusivity to the exact values $\overline{D}$, labelled as $D/\overline{D}$ (A) with the corresponding standard deviation values and the estimated μFA values (B) with the corresponding standard deviations are shown as dots/circles and error bars, respectively, as a function of the maximum attenuation factor $b_{max}\overline{D}$ for signal to noise level of 30.

For μFA estimation, the optimal choice of the b-values is important. To investigate the optimal range of b-values, a Monte-Carlo error analysis depicted in FIGS. 9A and 9B has been performed. The echo-signal was generated as a function of 16 equally spaced b-values between 0 and $b_{max}$ for the cases of 1D and 2D curvilinear diffusion with randomly oriented domains. The upper limit, $b_{max}$, was varied and the attenuation factors $b\overline{D}$ were chosen to be identical for the 1D and 2D case. The signal was subjected to the Rician noise with a constant signal to noise, SNR=30, determined relative to the non-weighted signal. Isotropic and non-isotropic weighed attenuation data were analysed with the protocol described herein to obtain $\overline{D}$ and μFA parameters. This analysis was repeated in 1000 iterations by adding different simulated noise signals with the given SNR. The procedure yields the mean and the standard deviation of the estimated $\overline{D}$ and μFA, shown as dots/circles and error bars respectively in FIG. 9B.

The optimal range of the diffusion weighting b is given by a compromise between accuracy and precision of the μFA analysis and it depends on the mean diffusivity. If the maximum b value used is lower than $1/\overline{D}$, the μFA tends to be underestimated, while for maximum b values larger than $1/\overline{D}$ the μFA tends to be overestimated. On the other hand the accuracy of μFA is compromised particularly at too low values of the maximum b, due to increased sensitivity to noise. See FIG. 9B.

The invention claimed is:

1. A method for magnetic resonance (MR) and/or MR imaging, the method comprising:
    performing a diffusion encoding scheme comprising a radio frequency (RF) and gradient sequence causing an isotropic diffusion weighting; and
    acquiring signals resulting from the diffusion encoding scheme,
    wherein the isotropic diffusion weighting is proportional to a trace of a diffusion tensor D,
    wherein the isotropic diffusion weighting is achieved by one time-dependent dephasing vector q(t) having an orientation,
    wherein the orientation of the time-dependent dephasing vector q(t) is varied discretely in more than three directions in total, changed continuously, or changed in a combination of discretely and continuously during a gradient pulse sequence, $0 \leq t \leq t_E$, where t represents time and $t_E$ represents echo time, wherein the isotropic diffusion weighting is invariant under rotation of the diffusion tensor D and wherein an equation $$\int_0^{t_E} F(t)^2 \hat{q}^T(t) \cdot D \cdot \hat{q}(t) \, dt = t_d \overline{D}$$

is fulfilled, F(t) being a time-dependent normalized magnitude of the dephasing vector, q̂(t) being a time-dependent unit direction vector, $t_d$ being an effective diffusion time given by $$t_d = \int_0^{t_E} F(t)^2 \, dt$$

and $\overline{D}$ being an isotropic mean diffusivity.

2. The method according to claim 1, wherein a time-dependent normalized magnitude F(t) of the dephasing vector is $|F(t)| \leq 1$ during an echo time $t_E$ from t=0 to t=$t_E$ and wherein the orientation of the dephasing vector at time 0 is identical to the orientation of the dephasing vector at time $t_E$.

3. The method according to claim 1, wherein orientation of the time-dependent dephasing vector q(t) is changed with discrete steps in azimuth angle ψ, providing q(t) vector steps through at least four orientations with unique values of $e^{i\psi}$, such that ψ modulus $2\pi$ are equally spaced values.

4. The method according to claim 1, wherein the isotropic diffusion weighting is achieved by a continuous sweep of the time-dependent dephasing vector q(t) where an azimuth angle ψ(t) and a magnitude thereof is a continuous function of time so that the time-dependent dephasing vector q(t) spans an entire range of orientations parallel to a right circular conical surface and so that the orientation of the time-dependent dephasing vector q(t) at time 0 is identical to the orientation at time $t_E$.

5. The method according to claim 4, wherein a particular inclination ζ is chosen to be a constant, time-independent value.

6. The method according to claim 5, wherein a particular inclination ζ is chosen so that $\zeta = \zeta_m = a\cos(1/\sqrt{3})$.

7. The method according to claim 3, wherein the time-dependent normalized magnitude of the dephasing vector, F(t), is chosen as a harmonic function of time.

8. The method according to claim 1, wherein the method is performed in a single shot.

9. The method according to claim 1, wherein the orientation of the time-dependent dephasing vector q(t) is changed continuously.

* * * * *